(12) United States Patent
Grodzki

(10) Patent No.: US 10,126,396 B2
(45) Date of Patent: *Nov. 13, 2018

(54) OPTIMIZATION OF A MAGNETIC RESONANCE SEQUENCE OF A MAGNETIC RESONANCE APPARATUS

(71) Applicant: Siemens Aktiengesellschaft, Munich (DE)

(72) Inventor: David Grodzki, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 629 days.

This patent is subject to a terminal disclaimer.

(21) Appl. No.: 14/603,690

(22) Filed: Jan. 23, 2015

(65) Prior Publication Data

US 2015/0204959 A1 Jul. 23, 2015

(30) Foreign Application Priority Data

Jan. 23, 2014 (DE) ........................ 10 2014 201 236

(51) Int. Cl.
*G01R 33/56* (2006.01)
*G01R 33/54* (2006.01)

(52) U.S. Cl.
CPC ....... *G01R 33/5608* (2013.01); *G01R 33/543* (2013.01); *G01R 33/546* (2013.01)

(58) Field of Classification Search
None
See application file for complete search history.

(56) References Cited

U.S. PATENT DOCUMENTS 4,965,521 A 10/1990 Egloff
5,758,646 A * 6/1998 Van Der Meulen ... G01R 33/54
324/309

(Continued)

FOREIGN PATENT DOCUMENTS

CN 1131906 A 9/1996
DE 102007043445 A1 4/2009
WO WO-2009/034115 A1 3/2009

OTHER PUBLICATIONS

Heismann et al, DE 102013202559, "Optimization of a Pulse Sequence for a Magnetic Resonance System", (English Machine Translation, Published Aug. 8, 2014, Foreign Application Priority Data filing Feb. 18, 2013).*

*Primary Examiner* — Dixomara Vargas
(74) *Attorney, Agent, or Firm* — Schiff Hardin LLP

(57) ABSTRACT

In a method to optimize a magnetic resonance sequence of a magnetic resonance apparatus, a method to operate a magnetic resonance apparatus, and a sequence optimization unit, and a magnetic resonance apparatus and an encoded storage medium that implement such a method, a magnetic resonance sequence is adopted as a starting sequence that includes multiple gradient pulses, the multiple gradient pulses occurring respectively on multiple gradient axes, and the multiple gradient axes each including a number of fixed point time intervals that are to be left unchanged and a number of modifiable time intervals that may be optimized. The gradient pulses on the multiple gradient axes are separately analyzed to identify the fixed point time intervals of the multiple gradient axes and the modifiable time intervals of the multiple gradient axes in the starting magnetic resonance sequence. At least one gradient pulse on one of the multiple gradient pulses is automatically optimized, that occurs during at least one modifiable time interval.

9 Claims, 4 Drawing Sheets

(56) References Cited

U.S. PATENT DOCUMENTS

| | | |
|---|---|---|
| 8,030,920 B2 | 10/2011 | Vu et al. |
| 8,030,923 B2 | 10/2011 | Yu et al. |
| 2003/0042905 A1 | 3/2003 | Miyazaki et al. |
| 2003/0216633 A1* | 11/2003 | Licato .................. G01R 33/561 600/410 |
| 2005/0240095 A1* | 10/2005 | Schaffter .............. G01R 33/583 324/309 |
| 2010/0308829 A1 | 12/2010 | Vu et al. |
| 2013/0253876 A1 | 9/2013 | Pfeuffer et al. |
| 2014/0232396 A1* | 8/2014 | Grodzki ............... G01R 33/543 324/309 |

\* cited by examiner

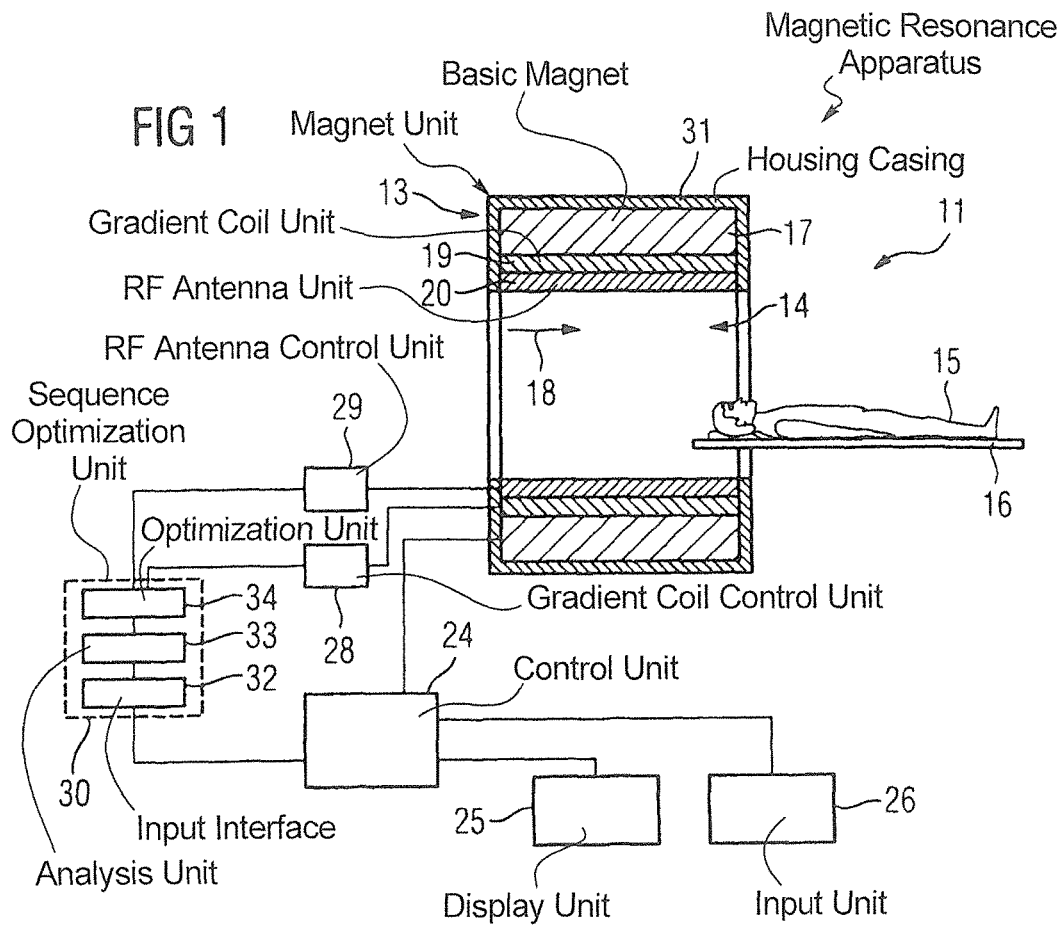
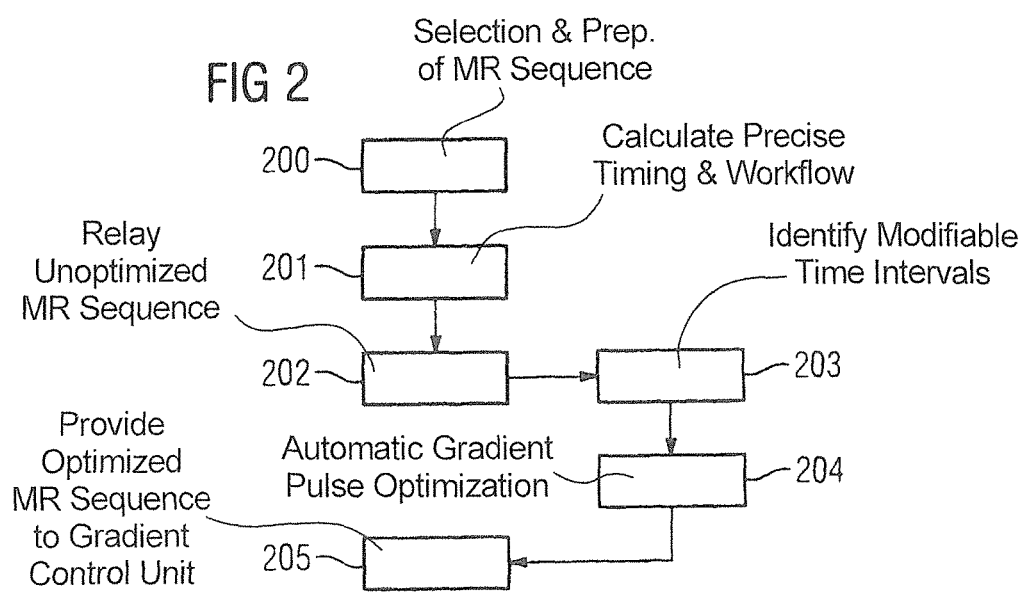

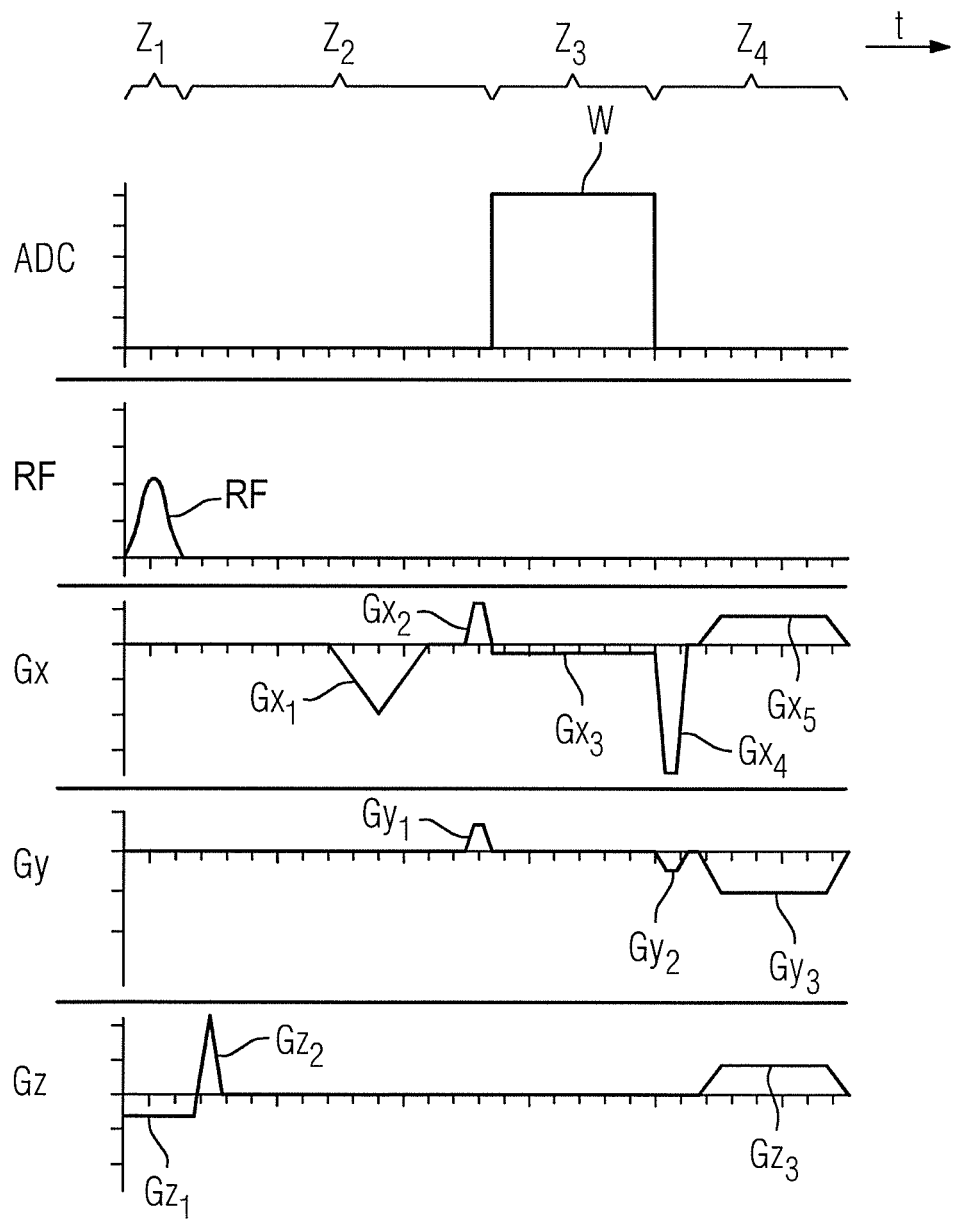

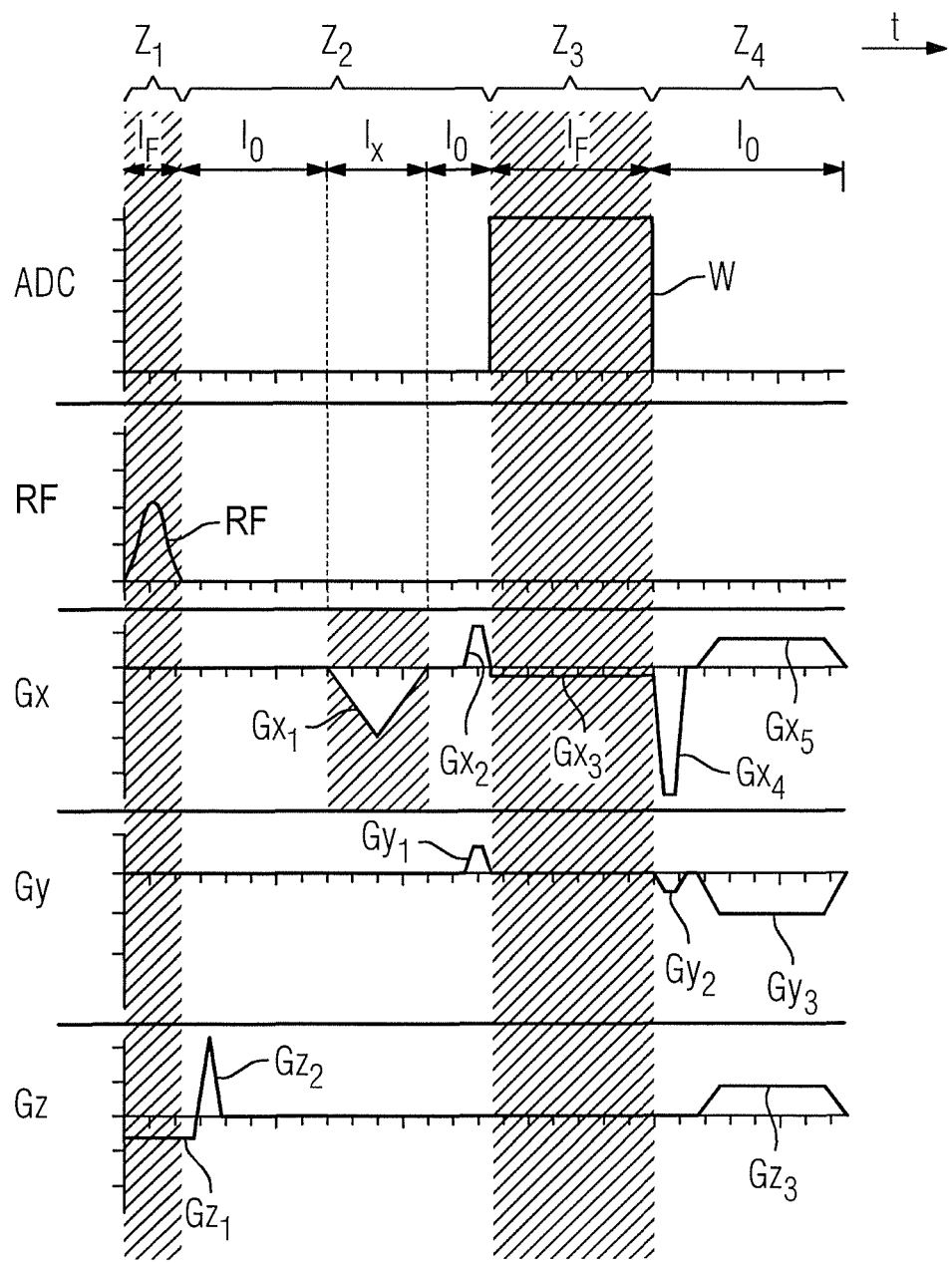

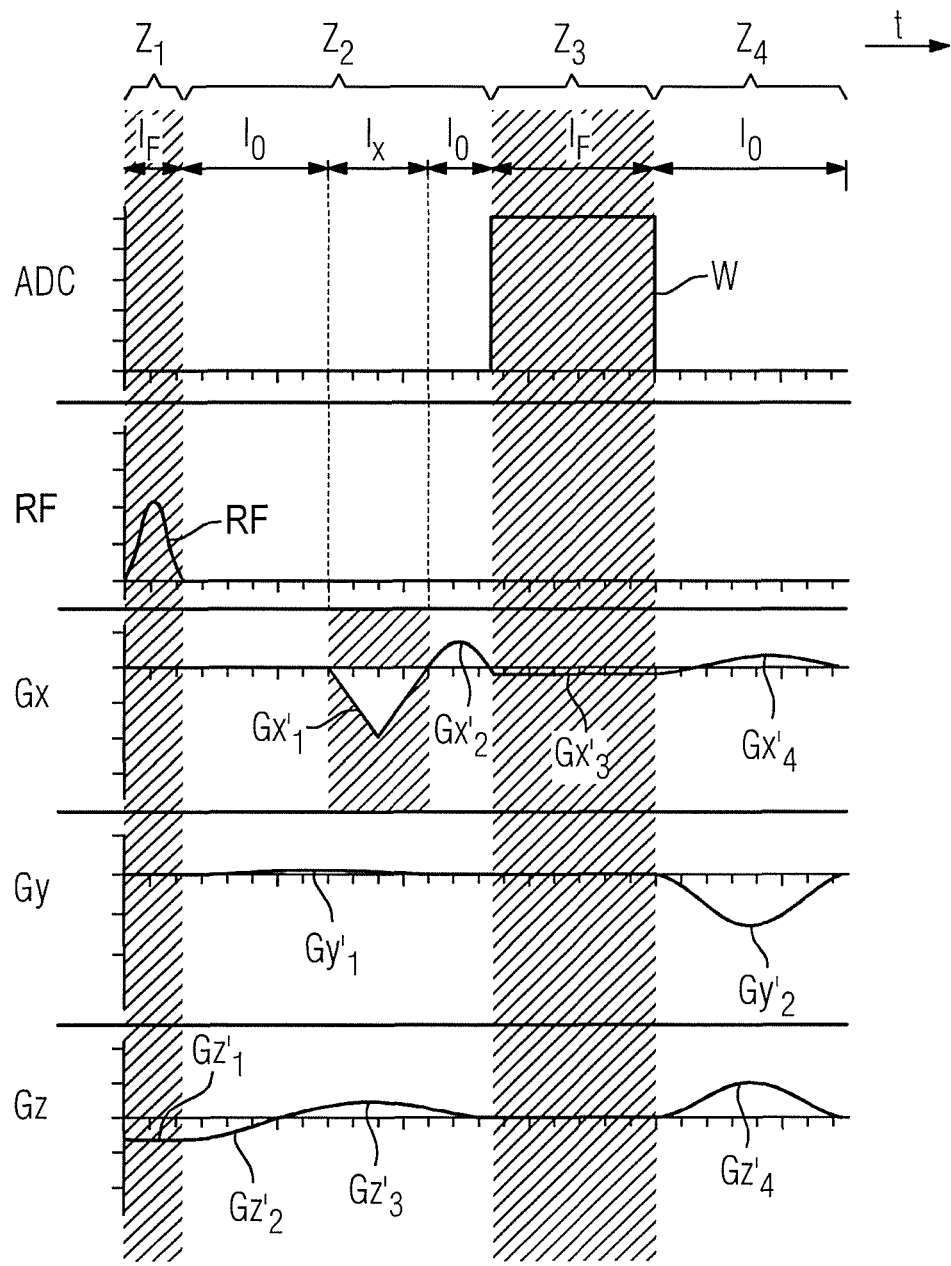

OPTIMIZATION OF A MAGNETIC RESONANCE SEQUENCE OF A MAGNETIC RESONANCE APPARATUS

BACKGROUND OF THE INVENTION

Field of the Invention

The invention concerns a method to optimize a magnetic resonance sequence of a magnetic resonance apparatus that operates according to such an optimized sequence, a method to operate a magnetic resonance apparatus with such an optimized sequence, a sequence optimization unit to provide such an optimized sequence, a magnetic resonance apparatus that operates according to such an optimized sequence, and a non-transitory, computer-readable storage medium encoded with programming instructions that, when executed by a computer, produce such an optimized sequence.

Description of the Prior Art

In a magnetic resonance apparatus (also called a magnetic resonance tomography system), the body of an examination subject (in particular a patient) that is to be examined is typically exposed to a relatively high basic magnetic field, for example of 1, 5, 3 or 7 Tesla, generated by a basic magnet. A magnetic field gradient is additionally applied by the operation of a gradient control unit. Radio-frequency pulses (excitation signals) are then emitted via a radio-frequency antenna unit, which causes the nuclear spins of specific atoms in the subject that are excited to resonance by these radio-frequency pulses, to be deflected (flipped) relative to the magnetic field lines of the basic magnetic field. Upon relaxation of the nuclear spins, radio-frequency signals (known as magnetic resonance signals) are radiated that are received by suitable radio-frequency antennas and then are processed further. The desired image data are reconstructed from the raw data acquired in such a manner.

For a defined measurement, a defined magnetic resonance sequence (also called a pulse sequence) is to be emitted that is composed of a series of radio-frequency pulses (in particular excitation pulses and refocusing pulses as well as gradient pulses in coordination therewith that are activated) in different spatial directions. Readout windows must be set to match these chronologically. The readout windows predetermine the time periods in which the induced magnetic resonance signals are received. The timing within the magnetic resonance sequence, i.e. at which time intervals which gradient pulses follow one another, is significant to the imaging. A number of the control parameters are normally defined in what is known as a measurement protocol, which is created in advance and retrieved (from a memory, for example) for a specific measurement, and can possibly be modified on site by the operator who can provide additional control parameters—for example a specific slice interval of a stack that of slices to be measured, a slice thickness etc. A magnetic resonance sequence is then calculated on the basis of all of these control parameters.

SUMMARY OF THE INVENTION

An object of the invention is to provide an improved optimization of such a magnetic resonance sequence.

This object is achieved in accordance with the invention by a method to optimize a magnetic resonance sequence of a magnetic resonance apparatus, with the following steps:
adopt a magnetic resonance sequence that includes multiple gradient pulses, wherein the multiple gradient pulses are distributed on multiple gradient axes, wherein the multiple gradient axes respectively include a number of fixed point time intervals that are to be left unchanged and a number of modifiable time intervals that may be optimized, automatically analyze the magnetic resonance sequence separately for the multiple gradient axes to identify the fixed point time intervals of the multiple gradient axes and the modifiable time intervals of the multiple gradient axes in the magnetic resonance sequence, respectively, and automatically optimize at least one gradient pulse among the multiple gradient pulses, this at least one gradient pulse occurring during at least one modifiable time interval.

Preferably, a magnetic resonance sequence that is finished, i.e. ready for emission, but this is still optimizable, is adopted in the method according to the invention is adopted. This magnetic resonance sequence typically includes a number (i.e. one or more) radio-frequency pulses, for example at least one excitation pulse and/or refocusing pulse, as well as a number of gradient pulses to be switched in chronological coordination with these. The gradient pulses are typically defined by their gradient amplitude, the gradient pulse duration and the edge steepness, meaning the first derivative of the gradient curve dG/dt of the gradient pulses (also typically designated as a slew rate). An additional important value of the gradient pulses is the gradient pulse moment (also called moment or gradient moment), which is defined by the integral of the amplitude over time. The precise parameters of the radio-frequency pulses (i.e. the temporal position and shape) are typically determined exactly within the magnetic resonance sequence; the individual gradient pulses are similarly predetermined exactly via defined parameters such as time length, amplitude, edge steepness. The magnetic resonance sequence and its parameters thereby typically result from the imaging object to be achieved.

A magnetic resonance sequence is typically communicated to a control unit in the form of chronologically successive sequential time intervals (also called event blocks), with which the control unit then controls (for example) the radio-frequency antenna unit to emit the individual radio-frequency pulses and a gradient coil unit to emit the individual gradient pulses. In the method according to the invention, the communication of the magnetic resonance sequence to a sequence optimization unit typically takes place in the form of time intervals. Each time interval normally characterizes a specific event, for example the emission of a fat saturation pulse, a defined spoiler gradient, a defined repetition within a gradient echo sequence, etc. Under the circumstances, the individual events can include multiple radio-frequency pulses or switched (activated) readout windows, as well as gradient pulses activated to match these. As typically understood, a switching of a readout window means the activation of a reception device for the magnetic resonance signals, for example of an ADC (analog/digital converter), that is connected to reception coils of the magnetic resonance apparatus.

Furthermore, an automatic analysis of the magnetic resonance sequence in order to identify the fixed point time intervals in the magnetic resonance sequence that are to be left unchanged, and in order to identify modifiable time intervals in the magnetic resonance sequence that may be optimized, takes place by operation of the sequence optimization unit, in particular an analysis unit. As used herein, fixed point time intervals are individual time points or time intervals in which the current values of the gradient pulses remain unmodifiable so that the gradient pulses can continue to fulfill their proper function. For example, among these are slice selection gradients or gradient pulses during the readout times that serve to achieve a specific coding at a specific point in time. Additional examples are provided below.

In addition to these unmodifiable individual points or time intervals at which a specific gradient pulse must have a very specific value, there are typically modifiable time intervals situated in between these in which gradient pulses must be entirely or partially arranged that, although they also satisfy a defined function, do not depend on the time specifications being precisely complied with and, for example, on a specific amplitude of the gradient pulse being present at a very exact point in time. It often merely depends on a predetermined amplitude being achieved up to a defined point in time; on a predetermined amplitude of the gradient pulse being ramped down as of a defined point in time; or on at least a defined moment of the gradient pulse being achieved within a broader time interval. In these time intervals, the curve of the gradient pulses (i.e. the shape of the gradient pulse, the pulse shape, or the gradient curve) can in principle be modified while heeding defined boundary conditions so that these modifiable time intervals are available for an optimization.

In a further step, the automatic optimization of at least one gradient pulse then takes place in a modifiable time interval. The automatic optimization preferably takes place according to a predetermined optimization criterion. In principle, an arbitrary optimization criterion can be provided.

For example, in a variant within the scope of the invention an optimization can be implemented so that the coding via the gradient pulses takes place as quickly as possible in order to minimize possible flow artifacts due to moving substances, for example blood flow.

In a preferred variant, for example, an optimization of the at least one gradient pulse takes place for noise reduction. During a magnetic resonance sequence, the magnetic gradient coils via which the gradient pulses are emitted are switched often and rapidly. Since the time specifications within a magnetic resonance sequence are most often very strict, and in addition to this the total duration of a magnetic resonance sequence (which determines the total duration of a magnetic resonance examination) must be kept as short as possible, gradient amplitudes around 40 mT/m and slew rates of up to 200 mT/m/ms must be achieved in part. In particular, such a high edge steepness contributes to the known noise development during the switching of the gradient pulses. Eddy currents in different components of the magnetic resonance apparatus, in particular the radio-frequency shield, are one reason for this noise development. In addition to this, steep edges of the gradient pulses lead to a higher power consumption and additionally place high demands on the gradient coils and the additional hardware. The rapidly changing gradient fields lead to distortions and oscillations in the gradient coils and to the transfer of these energies to the housing of the magnetic resonance apparatus. If the basic magnetic field is generated by a superconducting magnet that is cooled by liquid helium, a high helium boil-off can occur due to heating of the coils and the additional components.

For noise optimization, in the modifiable time intervals the first derivative of the gradient curve can particularly preferably be optimized. This means that the gradient curve in the at least one modifiable time interval is optimized so that, for example, an optimally low slew rate (since this leads to particularly high noise levels) of the gradient pulse is complied with under defined boundary conditions. The gradient curve is preferably smoothed in the optimization since a particularly good noise reduction is achieved in this way. In other words: the optimization step takes place with regard to an optimally high level of noise reduction in that the gradient curve of the at least one gradient pulse is optimized with regard to the minimization of the first derivative of the function which predetermines the gradient curve. Furthermore, a lower loading of the gradient curve is therefore achieved. A lower power consumption, a lower heating of the gradient coils and therefore also a reduced helium boil-off are therefore incurred. Furthermore, new possibilities to create more cost-effective gradient coils result from this. However, amplitudes of the at least one gradient pulse can thereby additionally be minimized.

Since an optimization of the noise reduction (i.e. an optimization of the first derivative of the gradient curve) is presumably the most common use case, this variant is most often assumed as an example in the following. However, the method should not be limited to this optimization criterion insofar as this is not explicitly noted.

The optimization preferably takes place independently of the optimization criterion that is used, while keeping the time length of the respective time intervals constant so that the timing of the magnetic resonance sequence remains unaffected overall by the optimization. In principle, it is also possible to provide different optimization criteria, for example also different optimization criteria for different time segments or different types of gradient pulses.

In the method according to the invention, the entire gradient curve is advantageously optimized automatically without considering the individual gradient pulses. The gradient curve is left at the defined value only at the important points in time and/or in the fixed point time intervals of the magnetic resonance sequence which are (as described) unmodifiable with regard to the current gradient amplitudes. All regions in between these, even regions spanning across gradient pulses, are accessible to an optimization of the gradient curve.

The gradient curves are individually optimized separately on the individual gradient axes (i.e. gradient directions). This means that the gradient curve is considered and optimized separately in each gradient axis, for example x-, y-, z-directions, for example the readout direction, the phase coding direction and the slice selection direction.

The automatic analysis of the magnetic resonance sequence also implemented so as to identify separately, for each of the multiple gradient axes, the fixed point time intervals of the multiple gradient axes and the modifiable time intervals of the multiple gradient axes. The multiple gradient axes are thus treated individually both for the analysis and for the optimization. For example, if an unoptimizable gradient pulse (for example a flow compensation gradient pulse) is present on only a first gradient axis, an unoptimizable fixed point time interval is placed only on the first gradient axis. Optimizable gradient pulses that are executed on additional gradient axes that are different than the first gradient axis during the unoptimizable gradient pulse of the first gradient axis can be optimized. The optimizable gradient pulses that take place on the additional gradient axes thus can be optimized in spite of the simultaneously-occurring unoptimizable gradient pulse on the first gradient axis. This avoids an unoptimizable gradient pulse from unnecessarily preventing the optimization of gradient pulses on other gradient axes. For example, an additional improvement of the noise reduction can be achieved by the optimization according to the invention.

One possibility to realize the procedure of the separate consideration of the gradient axes is the caching (buffering)

of unoptimizable gradient pulses in respective databases that are specific to the respective gradient axes. During the optimization of the gradient pulses, unoptimizable gradient pulses can then be recognized and executed accordingly without modification.

In an embodiment, the magnetic resonance sequence includes at least one time period during which a fixed point time interval is present on at least one first gradient axis among the multiple gradient axes, and a modifiable time interval is present on at least one additional gradient axis of the multiple gradient axes. In particular, the modifiable time interval of the at least one additional gradient axis is present simultaneously with the fixed point time interval of the at least one first gradient axis. This is particularly the case when an unoptimizable gradient pulse is present on the at least one first gradient axis during the at least one time period. During this at least one time period, no radio-frequency pulses are radiated and/or no readout of raw data takes place. In this time period, at least one gradient pulse which takes place on the at least one additional gradient axis during the modifiable time interval can then advantageously be optimized. This optimization of the at least one gradient pulse can take place although at the same time an unoptimizable gradient pulse is present on the at least one first gradient axis. For example, a noise reduction by means of the optimization method can thus be further improved.

In another embodiment, a time interval of a gradient axis of the multiple gradient axes is identified as a fixed point time interval of the gradient axis when, according to the magnetic resonance sequence, at least one of the following events should take place in the time interval:

Emission of a radio-frequency pulse. If a radio-frequency pulse is emitted simultaneously, it is to be assumed that the gradient pulse switched at this time serves to the effect that the radio-frequency pulse acts on a defined spatial volume. A variation of the amplitude of the gradient pulse during this time interval would therefore lead to an adulteration of the magnetic resonance sequence. The emission of a radio-frequency pulse thereby typically leads to the situation that fixed point time intervals are present on all gradient axes during the emission of the radio-frequency pulse.

Readout of raw data, meaning the placement of a readout window, in particular switching an ADC to be ready to receive. Here the simultaneously switched gradient pulses also serve for a coding of in which spatial region the magnetic resonance signals can be received. During this time period, a variation of the gradient amplitude would also lead to an adulteration of the magnetic resonance sequence. The readout of raw data thereby typically leads to the situation that fixed point time intervals are present on all gradient axes during the readout of the raw data.

Switching of a flow compensation gradient pulse on the gradient axis. This is typically comprised of two gradient moments of equal magnitude but different polarity. If this gradient pulse were to be modified, the flow compensation could be destroyed since the oppositely directed moments would be combined into a zero moment in the optimization.

Switching of a diffusion gradient pulse on the gradient axis. These diffusion gradient pulses also serve to apply a defined gradient amplitude over very specific time intervals in order to thus achieve a specific coding of the signal. A modification here would therefore also lead to an adulteration of the measurement.

Switching a knock gradient pulse. Such knock gradient pulses (also called "tok-tok-tok pulses") serve to generate a defined knock noise at the beginning of a measurement. This noise is not so loud as to be disturbing, but is loud enough to be easily heard. The patient located in the scanner can prepare himself or herself for the situation that the measurement will now begin, with a (normally unavoidable) noise exposure. If such knock gradient pulses were to be subjected to a noise optimization, for example, this would lead to a noise reduction of the knock gradient pulses, which then no longer satisfy their function of forewarning the patient.

It should be noted that the gradient pulses that are "not modifiable" per se can possibly also include optimizable time intervals, for example the edges thereof can be modified as long as the plateau parameters (height and length) are maintained.

The switching of an unoptimizable gradient pulse—for example a flow compensation gradient pulse, a diffusion gradient pulse or a knock gradient pulse—on a first gradient axis advantageously leads to the situation that modifiable time intervals can simultaneously be present on additional gradient axes that are different from the first gradient axis. The first gradient axis can be an arbitrary one of the multiple gradient axes. The presence of an unoptimizable gradient pulse on the first gradient axis thus does not prevent the optimization of gradient pulses on the additional gradient axes. Additional unoptimizable gradient pulses that appear to those skilled in the art to be reasonable can also be present. Furthermore, for example, blocking gradient pulses are also conceivable during which fixed point time intervals are present on all gradient axes due to the design of the blocking gradient pulses.

One embodiment provides that the identification of a time interval of a gradient axis as a fixed point time interval or as a modifiable time interval takes place via at least one of the following procedures:

Analyze the radio-frequency pulse transmission times;

Analyze the readout times;

Analyze a gradient curve of the gradient pulses of the gradient axis, for example in that these are compared with predetermined template gradient curves for defined, unmodifiable gradient pulses. If a gradient pulse corresponds to this template gradient curve, this is an indication that it is such an unmodifiable gradient pulse;

Analyze designators included in a parameter set, for example names, flags etc. that indicate that the following gradient pulse in the appertaining time interval is an unmodifiable gradient pulse. For example, a time interval that includes a specific gradient pulse can include the individual amplitude values at defined points in time predetermined in a fixed sampling grid. Alternatively, however, the parameters about a rise time; the maximum amplitude to be achieved after a defined time; the duration of a plateau time in which the amplitude can be kept constant; and a decline time can also be included in order to completely define the gradient pulse. In both cases, the time interval and/or the parameter set can also additionally include an information as to whether the time interval includes an unmodifiable gradient pulse or even a coding and/or designation as to what type of gradient pulse it is, for example a flow compensation gradient pulse, a diffusion gradient pulse, etc. The parameter set can also be associated with at least one gradient pulse.

Moreover, it is also possible not only that the aforementioned gradient pulse types are defined as unmodified, but rather that additional gradient pulses or types of gradient pulses are established as unmodifiable for the specific magnetic resonance sequence as needed, for example in that the analysis unit is adjusted accordingly in order to identify such defined, unmodifiable additional gradient pulses and/or in that corresponding designators for these gradient pulses are placed in the parameter sets, for example.

The preferred variants cited in the preceding show that it is possible with normally relatively simple means to identify the fixed point time intervals and to optimize the remaining time intervals.

In a number of magnetic resonance sequences that are often used in clinical magnetic resonance tomography (MRT)—for example in spin echo sequences (SE sequences) or in turbo spin echo sequences (TSE sequences)—gradient spoiler pulses (spoilers, for short) are executed in addition to the gradient pulses necessary for a spatial coding. Gradient spoiler pulses (which are also called gradient crusher pulses—crushers, for short—in particular if they occur in pairs) are executed by the same gradient coils immediately before and/or after the actual gradient pulses and ensure that, for example, unwanted free induction decay (FID) signals are suppressed.

It is such spoiler and/or crusher gradients that often lead to a high noise volume, such that it is desirable to optimize such gradient pulses. In many cases, it is important for the optimized gradient pulses to have a specific moment. As explained above, the moment of a gradient pulse is the integral of the amplitude over time, i.e. the area under the gradient pulse. Depending on whether the gradient pulse is positive or negative, the moment can also be positive or negative. For example, the spoilers or crushers will also each have a precisely defined spoiler or crusher moment so that they suppress the FID signals with certainty.

In an embodiment, the moment of the gradient pulse is kept constant in the optimization of the at least one gradient pulse.

In another embodiment, a gradient amplitude of the at least one gradient pulse is kept constant at fixed points in the optimization of the at least one gradient pulse, wherein the fixed points preferably include at least edge values at interval boundaries of the at least one modifiable time interval with adjoining fixed point time intervals. Specific fixed points within the optimizable time interval can be provided, for example the amplitude value reaching a value of zero at a very specific point in time. However, the fixed point time intervals preferably include at least the edge values at interval boundaries of the modifiable time interval with adjoining fixed point time intervals. Insofar as a re-sorting of the event blocks into outgoing event blocks which respectively include only either a modifiable time interval or a fixed point time interval takes place, the edge values are then the limit values at the start and end of the respective optimizable outgoing event blocks, for example. Through this boundary condition, it is ensured that there are no discontinuities (jumps) in the gradient curve, and the shape of the gradient pulse is chosen such that it proceeds steadily across event block boundaries and/or across boundaries between fixed point time intervals and modifiable time intervals.

In another embodiment, the slope (rise) of the gradient amplitude of the at least one gradient pulse is kept constant at fixed points in the optimization of the at least one gradient pulse, wherein the fixed points preferably include at least edge values at interval boundaries of the at least one modifiable time interval with adjoining fixed point time intervals. A uniform transition of the gradient curve across time interval boundaries can thus be achieved without edges and/or breaks. An abrupt switching of the slew rate is also thus avoided. Particularly in the transition from an unoptimizable gradient pulse to the at least one optimizable gradient pulse on a gradient axis, care thus can be taken to keep the slope constant. A uniform transition between the unoptimizable gradient pulse and the at least one optimizable gradient pulse can thus be ensured.

In a further embodiment, that multiple adjoining gradient pulses of a gradient axis are combined into a common gradient pulse. This provides particular advantage because the gradient amplitude is not unnecessarily reduced to a value of zero only to subsequently rise again with a correspondingly steep edge in order to form the next gradient pulse.

In principle, different methods can be used for optimization in order to keep the first derivative of the gradient curve as low as possible and to thereby comply with the predetermined boundary conditions, in particular to reach the provided fixed points. It has turned out to be particularly effective to use what is known as a spline interpolation method. A fourth-order method is especially preferably used. In a spline interpolation, it is sought to interpolate given node points (thus in the present case the fixed points, for example) with the use of polynomials that are consistent interims of their factors, known as splines. Alternatively, a polynomial interpolation would also be usable. However, the spline interpolation method has the advantage that curve paths with defined approximation properties that are still useable can be achieved with little computing cost even when the fixed points are situated disadvantageously. In particular, a spline interpolation can be calculated with little linear cost.

To conclude the optimization, a gradient curve of the at least one optimized gradient pulse is checked for compliance with system specification parameters, preferably at least the compliance with a maximum allowable gradient amplitude and/or a maximum allowable slew rate. If the gradient curve of the at least one optimized gradient pulse does not comply with the system specification parameters, the gradient curve of the at least one optimized gradient pulse is replaced again with the original gradient curve of the at least one gradient pulse.

Furthermore, the magnetic resonance sequence can be transmitted to a gradient coil unit in the form of chronologically successive event blocks. Before the transmission to the gradient coil unit, arriving event blocks of the magnetic resonance sequence can be analyzed to identify the fixed point time intervals and the modifiable time intervals in the respective event block. A new subdivision of the magnetic resonance sequence into outgoing event blocks can take place depending on this. Each event block thereby normally characterizes a defined event, for example the emission of a fat saturation pulse, a specific spoiler gradient, a specific repetition within a gradient echo sequence etc. The individual events can under the circumstances be composed of multiple radio-frequency pulses and/or switched readout windows as well as gradient pulses switched to match these. The new subdivision preferably takes place so that either an event block includes only one fixed point time interval or one modifiable time interval. In other words: the fixed point time intervals and the modifiable time intervals are advantageously passed (for example from the analysis unit) as separate outgoing event blocks to the gradient coil unit, wherein adjoining fixed point time intervals and adjoining modifiable time intervals in adjoining incoming event blocks are particularly preferably combined into new outgoing event blocks. According to the invention, the outgoing event blocks that include a modifiable time interval are then initially subjected to the optimization step to optimize the gradient curve of at least one gradient pulse before they are then transmitted to the gradient coil unit. The outgoing event blocks that, by contrast, are composed only of a fixed point time interval, are passed unmodified to the gradient coil unit, if necessary after a delay so that they can again arrive at the gradient coil unit in matching chronological coordination with the outgoing event blocks that have been optimized in the meantime. This gradient coil unit then executes the unoptimized event blocks and the optimized event blocks in succession in the matching order, meaning that it sends the corresponding control commands to the radio-frequency antenna unit and the gradient coil unit so that the entire optimized magnetic resonance sequence is emitted in the correct chronological manner, preferably with an unmodified timing as before the optimization. The event blocks are thereby advantageously again respectively specifically placed for the multiple gradient axes. The new subdivision of the magnetic resonance sequence thus advantageously takes place separately for the multiple gradient axes.

Furthermore, the invention proceeds from a method to operate a magnetic resonance apparatus in which a magnetic resonance sequence is initially optimized in a method according to the invention for optimization of a magnetic resonance sequence, and then the magnetic resonance apparatus is operated using the optimized magnetic resonance sequence. During the measurement, i.e. when a patient lies in a patient tunnel of the magnetic resonance apparatus, less noise (for example) is then created given correspondingly selected optimization criterion, without losses in the image quality, and without the measurement duration being extended. The optimization can preferably be implemented online upon execution or directly before the execution of the magnetic resonance sequence.

Furthermore, the invention includes a sequence optimization unit to optimize a magnetic resonance sequence of a magnetic resonance apparatus. The sequence optimization unit has a computer that is designed to execute the method according to the invention. The sequence optimization unit is thus designed to execute the method to optimize a magnetic resonance sequence of a magnetic resonance apparatus as described above.

For this purpose, the sequence optimization unit includes an input interface which is designed to implement an adoption of a magnetic resonance sequence, wherein the magnetic resonance sequence includes multiple gradient pulses, wherein the multiple gradient pulses are distributed on multiple gradient axes, wherein the multiple gradient axes respectively include a number of fixed point time intervals that are to be left unmodified and a number of modifiable time intervals that may be optimized.

Furthermore, the sequence optimization unit includes an analysis unit which is designed to respectively implement an automatic analysis of the magnetic resonance sequence separately for the multiple gradient axes to identify the fixed point time intervals of the multiple gradient axes and the modifiable time intervals of the multiple gradient axes in the magnetic resonance sequence.

Furthermore, the sequence optimization unit comprises an optimization unit which is designed to implement an automatic optimization of at least one gradient pulse of the multiple gradient pulses, wherein the at least one gradient pulse takes place during at least one modifiable time interval.

Embodiments of the sequence optimization unit according to the invention are designed analogous to the embodiments of the method according to the invention. The sequence optimization unit can have additional control components which are necessary and/or advantageous for execution of a method according to the invention. The sequence optimization unit can also be designed to send control signals to a magnetic resonance apparatus and/or to receive and/or process control signals in order to execute a method according to the invention. The sequence optimization unit is preferably part of the control unit of the magnetic resonance apparatus and preferably is situated relatively closely upstream of the radio-frequency antenna unit and/or the gradient coil unit. Computer programs and additional software can be stored on a memory unit of the sequence optimization unit, by means of which computer programs and additional software a processor of the sequence optimization unit automatically controls and/or executes a method workflow of a method according to the invention.

The magnetic resonance apparatus according to the invention has such a sequence optimization unit. Therefore, the magnetic resonance apparatus is designed to execute a method according to the invention with the sequence optimization unit thereof. The sequence optimization unit can be integrated into the magnetic resonance apparatus. The sequence optimization unit can also be installed separately from the magnetic resonance apparatus. The sequence optimization unit can be connected with the magnetic resonance apparatus.

The invention also encompasses a non-transitory, computer-readable data storage medium that can be loaded directly into a memory of a programmable computer of a magnetic resonance apparatus, and that is encoded with programming instructions (program code) that cause the method according to the invention to be executed by the computer of said magnetic resonance apparatus. The method according to the invention thus can be executed quickly, robustly and so as to be identically repeatable. The programming instructions configure the computer so that it can execute the method steps according to the invention. The computer must satisfy the requirements (for example by having a suitable working memory, a suitable graphics card, or a suitable logic unit) so that the method steps can be executed efficiently. Examples of such an electronically readable data medium are a DVD, a magnetic tape, or a USB stick. All embodiments according to the invention of the method described above can be implemented when this control information (software) is read from the data medium and stored in a controller and/or computer of a magnetic resonance apparatus.

The advantages of the method according to the invention to operate a magnetic resonance apparatus, of the sequence optimization unit according to the invention, of the magnetic resonance apparatus according to the invention and of the computer program product according to the invention essentially correspond to the advantages of the method according to the invention for optimization of a magnetic resonance sequence which are stated in detail above. The functional features of the method are developed in the sequence optimization unit by corresponding substantive modules, in particular via hardware modules.

BRIEF DESCRIPTION OF THE DRAWINGS

FIG. 1 schematically illustrates a magnetic resonance apparatus according to the invention for execution of a method according to the invention.

FIG. 2 is a flowchart of an embodiment of the method according to the invention.

FIG. 3 is a sequence diagram of a magnetic resonance sequence that is to be optimized according to the method according to the invention.

FIG. 4 shows the sequence diagram according to FIG. 3, wherein gradient axes are subdivided into fixed point time intervals and modifiable time intervals.

FIG. 5 shows the sequence diagram according to FIG. 4 and FIG. 3 after optimization of gradient pulses that takes place during the modifiable time intervals.

DESCRIPTION OF THE PREFERRED EMBODIMENTS

FIG. 1 shows, in a schematic presentation of a magnetic resonance apparatus 11 according to the invention for execution of a method according to the invention. The magnetic resonance apparatus 11 has a detector unit (scanner) formed by a magnet unit 13 with a basic magnet 17 to generate a strong and homogenous basic magnetic field 18. In addition to this, the magnetic resonance apparatus 11 has a cylindrical patient acquisition region 14 for an acquisition of a patient 15. The patient acquisition region 14 is cylindrically enclosed by the magnet unit 13 at its circumference. The patient 15 can be slid into the patient acquisition region 14 by a patient support 16 of the magnetic resonance apparatus 11. For this purpose, the patient support 16 has a patient table that is movable within the magnetic resonance apparatus 11. The magnet unit 13 is externally shielded by a housing casing 31.

Furthermore, the magnet unit 13 has a gradient coil unit 19 to generate magnetic field gradients that are used for a spatial coding during an imaging. The gradient coil unit 19 is controlled by a gradient coil unit 28. The magnetic field gradients are generated along gradient axes in the x-, y- and z-directions. For this purpose, the gradient coils of the gradient coil unit 19 can be controlled independently of one another in the x-, y- and z-directions so that, with a predetermined combination, gradients can be applied in arbitrary spatial directions (for example in the slice selection direction, in the phase coding direction or in the readout direction). These directions normally depend on the chosen slice orientation. The spatial directions of the gradient switchings can likewise also coincide with the x-, y- and z-directions; for example, the slice selection direction points in the z-direction, the phase coding direction points in the y-direction and the readout direction points in the x-direction. The x-direction is the direction that is situated horizontally orthogonal to the direction of the basic magnetic field 18 (the z-direction). The y-direction is the direction that is situated vertically orthogonal to the z-direction, and orthogonal to the x-direction.

Furthermore, the magnet unit 13 has a radio-frequency antenna unit 20 (which, in the shown case, is designed so as a body coil permanently integrated into the magnetic resonance apparatus 10) and a radio-frequency antenna control unit 29 for an excitation of a polarization that arises in the basic magnetic field 18 generated by the basic magnet 17. The radio-frequency antenna unit 20 is controlled by the radio-frequency antenna control unit 29 and radiates high-frequency radio-frequency pulses into an examination space that is essentially formed by the patient acquisition region 14.

The magnetic resonance apparatus 11 has a control unit 24 to control the basic magnet 17, the gradient coil unit 28 and the radio-frequency antenna control unit 29. The control unit 24 centrally controls the magnetic resonance apparatus 11, for example the implementation of magnetic resonance sequences. Control information (for example imaging parameters) and reconstructed magnetic resonance images can be displayed for a user at a display unit 25 (for example on at least one monitor) of the magnetic resonance apparatus 11. In addition to this, the magnetic resonance apparatus 11 has an input unit 26 by means of which information and/or imaging parameters can be entered by a user during a measurement process. The control unit 24 can include the gradient control unit 28 and/or radio-frequency antenna control unit 29 and/or the display unit 25 and/or the input unit 26.

The magnetic resonance apparatus furthermore has a sequence optimization unit 30 that has a computer (not separately shown) for optimization of imaging parameters of magnetic resonance sequences. In addition, the sequence optimization unit 30 has an input interface 32, an analysis unit 33 and an optimization unit 34. The magnetic resonance apparatus 11, in particular the sequence optimization unit 30, is fashioned to execute a method according to the invention.

The shown magnetic resonance apparatus 11 can naturally include additional components that magnetic resonance apparatuses 11 conventionally have. The general functionality of a magnetic resonance apparatus 11 is known to those skilled in the art, so a detailed description of such additional components is not necessary.

FIG. 2 shows a flowchart diagram of an embodiment of the method according to the invention. In a first method step 200, a selection and preparation of the magnetic resonance sequence is initially implemented in a typical manner. This means that, via the input unit 26, a user typically establishes the type of magnetic resonance sequence and/or searches for a corresponding protocol in which a specific magnetic resonance sequence is defined. The protocols include various imaging parameters for the respective magnetic resonance sequence. Among these imaging parameters are specific ground rules for the desired magnetic resonance sequence, for example the type of magnetic resonance sequence, i.e. whether it is a spin echo sequence, a turbo spin echo sequence etc. Furthermore, amount these are the imaging parameters of: slice thickness; slice intervals; number of slices; resolution; repetition times; the echo times in a spin echo sequence etc. With the use of the input unit 26, the user can modify a portion of these imaging parameters in order to create an individual magnetic resonance sequence for a currently desired measurement. For this purpose, modifiable imaging parameters are offered to the user for modification, for example at a graphical user interface of the input unit 26.

In a further method step 201, the precise timing and the workflow of the magnetic resonance sequence are then calculated with the predetermined defined imaging parameters. The magnetic resonance sequence can be calculated in the control unit 24 that, for example, can be realized in the form of software components in a computer system of the magnetic resonance apparatus 11. The magnetic resonance sequence includes multiple gradient pulses, which respectively are activated on multiple gradient axes. The multiple gradient axes each include a number of fixed point time intervals that are to be left unmodified and a number of modifiable time intervals that may be optimized. The magnetic resonance sequence furthermore includes at least one time period during which a fixed point time interval is present on at least one first gradient axis of the multiple gradient axes, and a modifiable time interval is present on at least one additional gradient axis of the multiple gradient axes.

In a further method step 202, the relaying of the magnetic resonance sequence, which is ready for transmission but not yet optimized, takes place in the form of time intervals (also called event blocks). A direct relaying of the time intervals to the gradient control unit 28 and the radio-frequency antenna control unit 29 does not take place. Rather, in a further method step 202 the magnetic resonance sequence is initially relayed from the control unit 24 to the sequence optimization unit 30 for optimization of the magnetic resonance sequence before being relayed to the gradient control unit 28 and the radio-frequency antenna control unit 29. The input interface 32 of the sequence optimization unit 30 is designed to accept the magnetic resonance sequence that is actually finished, ready for transmission, but is to be optimized.

In a further method step 203, the analysis unit 33 of the sequence optimization unit 30 automatically analyzes the magnetic resonance sequence and thereby identifies fixed point time intervals of the multiple gradient axes and modifiable time intervals of the multiple gradient axes. The fixed point time intervals and modifiable time intervals are respectively identified separately for the multiple gradient axes. This is depicted as an example in the transition from FIG. 3 to FIG. 4.

During the automatic analysis of the magnetic resonance sequence, a time interval of a gradient axis within the magnetic resonance sequence is identified by the analysis unit 33 as a fixed point time interval at least when—according to the magnetic resonance sequence—at least one of the following events should take place in this time interval:
- emission of a radio-frequency pulse,
- readout of raw data,
- switching of a flow compensation gradient pulse on the gradient axis,
- switching of a diffusion gradient pulse on the gradient axis and
- switching of a knock gradient pulse on the gradient axis.

In order to identify a time interval of a gradient axis within the magnetic resonance sequence as a fixed point time interval or as a modifiable time interval, the analysis unit 33 implements at least one of the following:
- analysis of the radio-frequency pulse transmission times,
- analysis of the readout times,
- analysis of a gradient curve of the gradient pulses of the gradient axis, and
- analysis of identifiers included in a parameter set.

In a further method step 204, an automatic optimization of at least one gradient pulse of the multiple gradient pulses takes place by operation of the optimization unit 34 of the sequence optimization unit 30, with the at least one gradient pulse occurring during at least one modifiable time interval. The additional method step 204 is shown as an example in the transition from FIG. 4 to FIG. 5.

The optimization of the at least one gradient pulse takes place for noise optimization. For this purpose, the first derivative of the gradient curve of the at least one gradient pulse is preferably optimized automatically in the modifiable time intervals. The moment of the gradient pulse is also advantageously kept constant in the optimization of the at least one gradient pulse. In the optimization of the at least one gradient pulse, a gradient amplitude of the at least one gradient pulse is furthermore advantageously kept constant, wherein the fixed points preferably include at least edge values at interval boundaries of the at least one modifiable time interval with adjoining fixed point time intervals. The slope of a gradient amplitude of the at least one gradient pulse is likewise advantageously kept constant in the optimization of the at least one gradient pulse. The fixed points preferably include at least edge values at interval boundaries of the at least one modifiable time interval with adjoining fixed point time intervals. Lastly, in the optimization multiple adjoining gradient pulses of a gradient axis are combined, if possible, into a common gradient pulse.

In a further method step 205, the optimized magnetic resonance sequence is passed to the gradient control unit 28 and the radio-frequency antenna control unit 29. From the optimized magnetic resonance sequence, the gradient control unit 28 and the radio-frequency antenna control unit 29 generate the corresponding control commands and provide these to the radio-frequency antenna unit 20 and the gradient coil unit 19 so that the entire optimized magnetic resonance sequence is executed in the correct chronological order, for example with a noise volume that is reduced relative to before the optimization, for acquisition of magnetic resonance image data by means of the magnetic resonance apparatus 11.

The method steps of the method according to the invention that are shown in FIG. 2 are executed by magnetic resonance apparatus, in particular by the sequence optimization unit 30. For this purpose, the magnetic resonance apparatus, in particular the sequence optimization unit 30, has required software and/or computer programs that are stored in a memory unit of the magnetic resonance application 11 (in particular of the sequence optimization unit 30). The software and/or computer programs include program code designed to execute the method according to the invention when the program ode and/or software is executed in the magnetic resonance apparatus 11 (in particular in the sequence optimization unit 30), by a processor unit of the magnetic resonance apparatus 11 (in particular the sequence optimization unit 30).

As an example, FIG. 3 shows a sequence diagram of a portion of a very simplified magnetic resonance sequence that is subdivided as an example into four time intervals $Z_1$, $Z_2$, $Z_3$, $Z_4$. In this sequence diagram, the readout window W, the radio-frequency pulses RF that are to be emitted and the gradient pulses are respectively shown depending on the time t in a typical manner on different time axes situated one over another. The readout window W is thereby shown on the uppermost readout time axis ADC. The amplitudes of the radio-frequency pulses RF to be emitted are shown on the second-uppermost radio-frequency pulse time axis RF. The gradient pulses $Gx_1$, $Gx_2$, $Gx_3$, $Gx_4$, $Gx_5$ in the readout direction are shown on the underlying x-gradient axis Gx. Shown on the y-gradient axis Gy are the gradient pulses $Gy_1$, $Gy_2$, $Gy_3$ which are switched in the phase coding direction. The gradient pulses $Gz_1$, $Gz_2$, $Gz_3$ in the slice selection direction are shown on the lowermost z-gradient axis Gz. The position of the respective gradient axis Gx, Gy, Gz respectively indicates the zero line, meaning that the gradient pulses can have negative or positive amplitudes in the gradients depending on whether their amplitudes extend downward or upward from the gradient axis Gx, Gy, Gz. In all sequence diagrams, for simplification the scaling in the time direction and in the amplitude direction takes place only in arbitrary units.

During the first time interval $Z_1$ of the magnetic resonance sequence, a radio-frequency pulse RF is emitted to excite the nuclear spins. During this, a gradient pulse $Gz_1$ on the z-gradient axis Gz (the slice selection direction) is executed during the first time interval $Z_1$ so that the radio-frequency pulse $RF_1$ acts slice-selectively.

Immediately after the end of this radio-frequency pulse RF, multiple gradient pulses take place on all three gradient axes Gx, Gy, Gz in a second time interval $Z_2$. An unoptimizable gradient pulse $Gx_1$ (for example a flow compensation gradient pulse, a diffusion gradient pulse or a knock gradient pulse) and an additional optimizable gradient pulse $Gx_2$ take place on the x-gradient axis Gx. An optimizable gradient pulse $Gy_1$ takes place on the y-gradient axis during the second time interval $Z_2$. Likewise, only an optimizable gradient pulse $Gz_2$ takes place on the z-gradient axis during the second time interval $Z_2$.

During the third time interval $Z_3$, a readout of magnetic resonance signals takes place during a readout window W. For this, a gradient pulse $Gx_3$ is switched on the x-gradient axis.

A fourth time interval $Z_4$ during which gradient pulses $Gx_4, Gx_5, Gy_2, Gy_3, Gz_3$ that can be optimized in parallel are switched on the x-, y- and z-gradient axis then follows these gradient echo time intervals.

FIG. 4 shows the sequence diagram of the magnetic resonance sequence from FIG. 3. Here fixed point time intervals $I_F$ and modifiable time intervals $I_O$ within the magnetic resonance sequence have been identified separately for each gradient axis in the further method step 203 by means of the analysis unit 33. The unoptimizable fixed point time intervals $I_F$ are each covered by a transversely banded pattern on each gradient axis. The modifiable time intervals $I_O$ are not covered by a transversely banded pattern.

Here the fixed point time intervals $I_F$ are the time intervals that do not fall under the criteria described above that identify a time interval as an unoptimizable fixed point time intervals. The first time interval $Z_1$ for all gradient axes Gx, Gy, Gz is thus a fixed point time interval $I_F$ since a radio-frequency pulse RF is emitted during the first time interval $Z_1$. The third time interval $Z_3$ is likewise a fixed point time interval $I_F$ for all gradient axes Gx, Gy, Gz since a readout window W is switched during the third time interval $Z_3$. The fourth time interval $Z_4$ has been identified by the analysis unit as a modifiable time interval $I_O$ for all gradient axes Gx, Gy, Gz since no radio-frequency pulse RF, no readout window W and no unoptimizable gradient pulse $Gx_1$ takes place during it.

Two modifiable time intervals $I_O$ for all gradient axes Gx, Gy, Gz are present in the second time interval $Z_2$. These include a time period $I_x$ of the second time interval $Z_2$ during which a fixed point time interval $I_F$ is present on the x-gradient axis and a modifiable time interval $I_O$ is respectively present on the y-gradient axis Gy and the z-gradient axis Gz. This is due to the fact that the unoptimizable gradient pulse $Gx_1$ is switched on the x-gradient axis Gx during the time period $I_x$. However, this does not prevent that the gradient pulses on the y-gradient axis Gy or the z-gradient axis Gz can be optimized.

In the modifiable time intervals $I_O$, the gradient pulses (in particular the gradient curve of the gradient pulses) can be varied arbitrarily under the following boundary conditions: the gradient amplitudes are advantageously constant at the boundary points with the adjoining time intervals that include the unoptimizable fixed point time intervals $I_F$. Furthermore, the slope of the gradient amplitudes is advantageously constant at the boundary points with the adjoining fixed point time intervals $I_F$. Furthermore, the entire moment of the gradient pulses in the respective optimizable time intervals $I_O$ will advantageously be the same before and after the optimization.

FIG. 5 shows the sequence diagram of the magnetic resonance sequence from FIG. 3 and FIG. 4 after the optimization of the magnetic resonance sequence by means of the optimization unit 34 of the sequence optimization unit 40.

In the shown example, the modifiable time intervals $I_O$ have been optimized separately for the three gradient axes Gx, Gy, Gz under the boundary conditions that have just been cited, wherein the gradient pulses result from FIG. 5. The optimization took place using a spline interpolation method, wherein the amplitude values at the edges are each considered as fixed points, and under the cited boundary conditions (reaching the fixed points, keeping the first derivative of the gradient curve constant at the fixed points, and keeping the integral under the gradient curve the same) a spline leads to a desired smooth gradient pulse in the respective optimizable time intervals $I_O$. The use of other optimization methods appearing to be reasonable to the person skilled in the art is likewise conceivable.

In comparison between FIG. 3 and FIG. 4 it is apparent how adjoining, relatively angular, unoptimized gradient pulses $Gx_2, Gx_4, Gx_5, Gy_1, Gy_2, Gy_3, Gz_2, Gz_3$ with steep edges have been converted into optimized gradient pulses $Gx_2', Gx_4', Gy_1', Gy_2', Gz_2', Gz_3', Gz_4'$ with shapes that are common in part that transition into one another. The optimized gradient pulses $Gx_2', Gx_4', Gy_1', Gy_2', Gz_2', Gz_3', Gz_4'$ are relatively smooth, therefore entail significantly smaller loads for the gradient coils and reduce the noise exposure.

As an example of a combination of gradient pulses, to the gradient pulses $Gy_2, Gy_3$ in the original magnetic resonance sequence according to FIG. 3 are combined into a common gradient pulse $Gy_2'$ in the optimized magnetic resonance sequence according to FIG. 5, as well as to the gradient pulses $Gx_4, Gx_5$ that have been replaced by a common shape $Gx_4'$.

In particular, it should be noted that the gradient amplitude of the gradient pulse $Gz_1$ has thereby not changed during the first time interval $Z_1$ in which a slice-selective radio-frequency pulse RF is emitted in parallel. This means that, in this first time period $Z_1$, the gradient curve of the original gradient pulse $Gz_1$ from FIG. 3 corresponds to the gradient curve of the gradient pulse $Gz_1'$ from FIG. 5. The same applies to the gradient pulse $Gx_3$, which takes place during the third time interval $Z_3$ with the readout window W. The gradient pulse $Gx_3$ from FIG. 3 is therefore identical to the gradient pulse $Gx_3$ from FIG. 5.

Finally, the unoptimizable gradient pulse $Gx_1'$ from FIG. 5 has also not been optimized relative to the corresponding unoptimizable gradient pulse $Gx_1$ from FIG. 3. However, the gradient pulse $Gx_2'$ that follows on the x-gradient axis has been optimized in its gradient curve relative to the gradient pulse $Gx_2$ from FIG. 3. The gradient pulse $Gx_2'$ at the boundary with the unoptimizable gradient pulse $Gx_1'$ has thereby been adapted in the slope of its amplitude to the slope of the amplitude of the unoptimizable gradient pulse $Gx_1'$.

Furthermore, it should be noted that the unoptimizable gradient pulse $Gx_1'$ that takes place on the x-gradient axis Gx has not prevented an optimization of the gradient pulses $Gy_1', Gz_2', Gz_3'$ of the y-gradient axis Gy and z-gradient axis Gz that take place simultaneously with said unoptimizable gradient pulse $Gx_1'$. A further improvement of the noise reduction could thus be achieved.

From FIG. 3 and FIG. 5, it can be seen how, with the optimization of the gradient pulses according to the embodiment of the method according to the invention, each magnetic resonance sequence can be effectively optimized very quickly with regard to the noise exposure and loading of the gradient coils just immediately before execution.

I claim as my invention:

1. A method to optimize a magnetic resonance sequence used to operate a magnetic resonance apparatus, comprising:
   providing a starting magnetic resonance sequence to a computer, said starting magnetic resonance sequence comprising a plurality of gradient pulses respectively occurring on a plurality of gradient axes, said plurality of gradient axes comprising a plurality of fixed time intervals that are not to be modified and a plurality of modifiable time intervals that may be modified, said starting magnetic resonance sequence comprising at least one time period, during which a fixed time interval is present on at least a first of said plurality of gradient axes, and a modifiable time interval that is present on at least one other gradient axis among said plurality of gradient axes;
   in said computer, automatically analyzing said starting magnetic resonance sequence individually and separately for the respective gradient axes in the plurality of gradient axes, to identify, on each gradient axis, said fixed time intervals and said modifiable time intervals;
   in said computer, automatically optimizing, in said at least one time period, at least one of said plurality of gradient pulses on at least one of said plurality of gradient axes only in at, least one of the modifiable time intervals that has been identified individually and separately for said at least one of said gradient axes, thereby producing an optimized magnetic resonance sequence in which said at least one of said plurality of gradient pulses on said at least one of said plurality of gradient axes has been optimized individually and separately from gradient pulses on other of said plurality of gradient axes;
   making said optimized magnetic resonance sequence available at an output of said computer in an electronic form suitable for operating a magnetic resonance apparatus in a form configured to operate a magnetic resonance data acquisition scanner; and
   operating the magnetic resonance data acquisition scanner with said optimized magnetic resonance sequence, including operating a gradient coil arrangement with said at least one gradient pulse, in order to acquire magnetic resonance data from a subject, and making the acquired magnetic resonance data available from the computer in electronic form.

2. A method as claimed in claim 1 comprising identifying a time interval on at least one of said gradient axes as a fixed time interval in which an event occurs selected from the group consisting of emission of a radio-frequency pulse, readout of raw data, activation of a flow compensation gradient pulse on said at least one axes, activation of a diffusion gradient pulse on said at least one axis, and activating a knock gradient pulse on said at least one gradient axis.

3. A method as claimed in claim 1 comprising identifying a time interval on at least one of said gradient axes as a fixed time interval or as a modifiable time interval by an analysis selected from the group consisting of analysis of radio-frequency pulse transmission times, analysis of readout times, analysis of a gradient curve of gradient pulses on said at least one gradient axis, and analysis of identifiers included in a parameter set provided to said computer.

4. A method as claimed in claim 1 comprising optimizing said at least one gradient pulse on said at least one of said gradient axes while maintaining a gradient moment of said at least one gradient pulse constant.

5. A method as claimed in claim 1 comprising optimizing said at least one gradient pulse on said at least one of said gradient axes by maintaining a gradient amplitude of said at least one gradient pulse constant, and defining a fixed point of said fixed time interval to include at least edge values at interval boundaries of said at least one modifiable time interval and adjoining fixed time intervals.

6. A method as claimed in claim 1 comprising optimizing said at least one gradient pulse on said at least one of said gradient axes by maintaining a slope of a gradient amplitude of said at least one gradient pulse constant, and defining a fixed point of said fixed time interval to include at least edge values at interval boundaries of said at least one modifiable time interval and adjoining fixed time intervals.

7. A method as claimed in claim 1 comprising, in said computer, combining multiple adjoining gradient pulses on a respective gradient axis among said plurality of gradient axes into a common gradient pulse in said optimized magnetic resonance sequence.

8. A sequence optimization unit for optimization of a magnetic resonance sequence for operation of a magnetic resonance apparatus, comprising;
   a computer comprising an input interface that receives a starting magnetic resonance sequence, said starting magnetic resonance sequence comprising a plurality of gradient pulses respectively occurring on a plurality of gradient axes, said plurality of gradient axes comprising a plurality of fixed time intervals that are not to be modified and a plurality of modifiable time intervals that may be modified said starting magnetic resonance sequence comprising at least one time period, during which a fixed time interval is present on at least a first of said plurality of gradient axes, and a modifiable time interval that is present on at least one other gradient axis among said plurality of gradient axes;
   said computer being configured to automatically analyze said starting magnetic resonance sequence individually and separately for the respective gradient axes in the plurality of gradient axes, to identify, on each gradient axis, said fixed time intervals and said modifiable time intervals;
   said computer being configured to automatically optimize, in said at least one time period, at least one of said plurality of gradient pulses on at least one of said plurality of gradient axes only in at least one of the modifiable time intervals that has been identified individually and separately for said at least one of said gradient axes, thereby producing an optimized magnetic resonance sequence in which said at least one of said plurality of gradient pulses on said at least one of said plurality of gradient axes has been optimized individually and separately from gradient pulses on other of said plurality of gradient axes; and
   said computer comprising an output interface at which said optimized magnetic resonance sequence is available as an output of said computer in an electronic form suitable for operating a magnetic resonance apparatus in order to acquire magnetic resonance data from a subject, and said computer being configured to make the acquired magnetic resonance data available from the computer in electronic form.

9. A non-transitory, computer-readable data storage medium encoded with programming instructions, said storage medium being loaded into a computer of a magnetic resonance sequence selection unit of a magnetic resonance apparatus, and said programming instructions causing said computer to:

receive a starting magnetic resonance sequence, said starting magnetic resonance sequence comprising a plurality of gradient pulses respectively occurring on a plurality of gradient axes, said plurality of gradient axes comprising a plurality of fixed time intervals that are not to be modified and a plurality of modifiable time intervals that may be modified said starting magnetic resonance sequence comprising at least one time period, during which a fixed time interval is present on at least a first of said plurality of gradient axes, and a modifiable time interval that is present on at least one other gradient axis among said plurality of gradient axes;

automatically analyze said starting magnetic resonance sequence individually and separately for the respective gradient axes in the plurality of gradient axes, to identify, on each gradient axis, said fixed time intervals and said modifiable time intervals;

automatically optimize, in said at least one time period, at least one of said plurality of gradient pulses on at least one of said plurality of gradient axes only in at least one of the modifiable time intervals that has been identified individually and separately for said at least one of said gradient axes, thereby producing an optimized magnetic resonance sequence in which said at least one of said plurality of gradient pulses on said at least one of said plurality of gradient axes has been optimized individually and separately from gradient pulses on other of said plurality of gradient axes;

make said optimized magnetic resonance sequence available at an output of said computer in an electronic form suitable for operating said magnetic resonance apparatus in a form configured to operate a magnetic resonance data acquisition scanner; and operate the magnetic resonance data acquisition scanner with said optimized magnetic resonance sequence, including operating a gradient coil arrangement with said at least one gradient pulse, in order to acquire magnetic resonance data from a subject, and make the acquired magnetic resonance data available from the computer in electronic form.

* * * * *